US010629686B2

(12) United States Patent
Pham et al.

(10) Patent No.: US 10,629,686 B2
(45) Date of Patent: Apr. 21, 2020

(54) CARBON-CONTROLLED OHMIC CONTACT LAYER FOR BACKSIDE OHMIC CONTACT ON A SILICON CARBIDE POWER SEMICONDUCTOR DEVICE

(71) Applicant: SEMICONDUCTOR COMPONENTS INDUSTRIES, LLC, Phoenix, AZ (US)

(72) Inventors: Thi Thu Phuong Pham, Bucheon (KR); Kyeongseok Park, Bucheon (KR); Andrei Konstantinov, Sollentuna (SE); Thomas Neyer, Munich (DE)

(73) Assignee: Semiconductor Components Industries, LLC, Phoenix, AZ (US)

( * ) Notice: Subject to any disclaimer, the term of this patent is extended or adjusted under 35 U.S.C. 154(b) by 1 day.

(21) Appl. No.: 16/052,876

(22) Filed: Aug. 2, 2018

(65) Prior Publication Data
US 2020/0044031 A1    Feb. 6, 2020

(51) Int. Cl.
*H01L 29/16* (2006.01)
*H01L 21/02* (2006.01)
(Continued)

(52) U.S. Cl.
CPC .... *H01L 29/1608* (2013.01); *H01L 21/02521* (2013.01); *H01L 21/0485* (2013.01);
(Continued)

(58) Field of Classification Search
CPC .................................................. H01L 26/1608
See application file for complete search history.

(56) References Cited

U.S. PATENT DOCUMENTS 6,599,644 B1 * 7/2003 Zekentes ............. H01L 21/0485
257/750
7,547,578 B2 6/2009 Agarwal et al.
(Continued)

FOREIGN PATENT DOCUMENTS

| CN | 103578960 A | 2/2014 |
| EP | 2079101 A1 | 7/2009 |
| EP | 2993690 A1 | 3/2016 |

OTHER PUBLICATIONS

Hanamura et al, "Heat Resistant Metallization Technique for SiC Power Devices, Review of Automotive Engineering," Jan. 2008, 375-380.
(Continued)

*Primary Examiner* — William A Harriston
(74) *Attorney, Agent, or Firm* — Brake Hughes Bellermann LLP

(57) ABSTRACT

A semiconductor power device may include a Silicon Carbide (SiC) layer having an active power device formed on a first surface thereof. An Ohmic contact layer may be formed on a second, opposing surface of the SiC layer, the Ohmic contact layer including Nickel Silicide (NiSix) with a first silicide region containing a first precipitate of non-reacted carbon disposed between the SiC layer and a second silicide region. The second silicide region may be disposed between the first silicide region and a third silicide region, and may include a mixture of a first precipitate of refractory metal carbide and a second precipitate of non-reacted carbon. The third silicide region may contain a second precipitate of refractory metal carbide. A solder metal layer may be formed on the Ohmic contact layer, with the third silicide region disposed between the second silicide region and the solder metal layer.

20 Claims, 15 Drawing Sheets

(51) Int. Cl.
    *H01L 21/268*    (2006.01)
    *H01L 21/04*     (2006.01)
    *H01L 29/45*     (2006.01)
    *H01L 23/00*     (2006.01)

(52) U.S. Cl.
    CPC ............ *H01L 21/268* (2013.01); *H01L 24/32* (2013.01); *H01L 29/456* (2013.01)

(56) References Cited

U.S. PATENT DOCUMENTS

| | | | |
|---|---|---|---|
| 8,440,524 B2 | 5/2013 | Fujiwara et al. | |
| 8,450,196 B2 | 5/2013 | Rupp et al. | |
| 2005/0104072 A1 | 5/2005 | Slater, Jr. et al. | |
| 2015/0048383 A1* | 2/2015 | Tsuji ..................... | H01L 29/40 257/77 |

OTHER PUBLICATIONS

Tous et al, "Nickel silicide formation using excimer laser annealing", Energy Procedia vol. 27 pp. 503-509, Apr. 3-5, 2012.

Yu Cao et al., "Contact Formation on Silicon Carbide by Use of Nickel and Tantalum in a Materials Science Point of View," Apr. 2011.

De Silva, et al. "Low Resistance Ohmic Contact Formation on 4H-SiC C-Face with NbNi Silicidation Using Nanosecond Laser Annealing." Materials Science Forum. vol. 858. Trans Tech Publications, pp. 549-552, 2016.

\* cited by examiner

CARBON-CONTROLLED OHMIC CONTACT LAYER FOR BACKSIDE OHMIC CONTACT ON A SILICON CARBIDE POWER SEMICONDUCTOR DEVICE

TECHNICAL FIELD

This description relates to silicon carbide high power semiconductor devices.

BACKGROUND

Silicon carbide (SiC) power devices, and, in particular, silicon carbide high power devices, provide advantages such as high switching speed and low power losses. Examples of highly-efficient SiC power devices include (but are not limited to) rectifiers, field-effect transistors (FETs) and bipolar Junction Transistors (BJTs). Multiple physical properties are responsible for the various advantages of silicon carbide high power devices, such as their high critical field for avalanche breakdown.

As a result, for example, a high voltage of between 800V and 4500V can be blocked within a very thin layer of, e.g., between approximately 4 μm and 35 μm. Mechanical stability considerations dictate a typical SiC substrate thickness of at least between approximately 300 to 500 um during at least some processing contexts, although such thicknesses may be higher than that required from the standpoint of electrical device function. That is, for example, electrical and thermal resistance of excessively thick substrates tends to impact the performance of SiC high power devices.

To mitigate such impacts, it is possible to perform thinning of at least a portion of the SiC substrate. Such thinned-down SiC substrates, as just referenced, may not be preferable or feasible during topside semiconductor processes, e.g., used to form active device structures. In particular, a 150-mm or larger SiC substrate that is thinner than approximately 280 μm may be incompatible with front-end SiC device processing in a wafer fabrication setting. Instead, wafer thinning may be performed at the stage at which the topside active structure is complete (or almost complete). As a result, wafer process post thinning may be limited to particular operations, such as Ohmic contact formation, followed by deposition of a solder metal. Annealing of the backside contact to achieve the desired Ohmic behavior and low contact resistance may be done in such scenarios using a source of pulsed energy, such as a pulsed laser with a pulse duration of a few nanoseconds to a few hundred nanoseconds. The contact anneal may then be followed by deposition of a solder metal stack.

A specific feature of SiC is that Ohmic contact formation typically requires a temperature of between approximately 850 C and 1050 C. This is particularly true for forming a nickel silicide (NiSix) contact, which provides low resistivity and good process stability. Nickel silicide can be formed on silicon carbide through reaction of SiC with metallic nickel, in a manner that is similar to that for formation of nickel silicide on silicon. On silicon carbide, this reaction is accompanied by release of excessive carbon, part of which carbon is captured at the SiC to NiSix interface, and part of which diffuses into the silicide to form carbon clusters in the bulk of the silicide, as well as on the free surface of the silicide. The carbon trapped at the SiC/NiSix interface is reported to have a structure of multiple-layer graphene, and advantageously forms an interface with a low barrier to SiC. Thus, this low barrier of carbon to the SiC is considered to be responsible for, or related to, the desired Ohmic properties of the NiSix contact on SiC.

However, excessive carbon production, and distribution thereof within the silicide, may result in a number of problems and difficulties. For example, such problems and difficulties may include poor metal adhesion (and lack of stability of resulting contact) for the contacts formed by furnace or by rapid thermal processing (RTP) anneal.

SUMMARY

In the following disclosure, techniques suitable for reliable formation of pulse laser-annealed backside contact layers for SiC power devices utilizing thinned SiC substrates are disclosed. As described, suitability has been verified, e.g., through studies of actual contact composition, as well as through reliability tests of fully-processed, diced and packaged SiC power devices.

The present disclosure describes devices capable of providing a near-theoretical combination of blocking voltage with on-state resistance. The limit for on-state specific resistance $R_{spon}$ of a vertical non-injection power device is set by the resistance of the drift region. For a non-punch-through device this number is $R_{spon}=4BV^2/(\epsilon^*\mu^*Ec^3)$, where BV is the breakdown voltage, E the absolute permittivity of semiconductor, μ the carrier mobility and Ec the critical field for avalanche breakdown.

A high-power rectifier may thus be understood to include a device having a specific resistance not exceeding 10× the theoretical value of $R_{spon}$. Devices with yet higher specific resistance may be of highly-limited use for high power conversion. The specific resistance $R_{spon}$ should be understood in its conventional definition, e.g., as the differential resistance of on-state rectifier or switch multiplied by the active device area, i.e. by the total area of device unit cells.

With respect to high power application, the rated current in such scenarios may be limited to the domain above a minimum current of between about 4 A and 10 A. Some high-voltage rectifiers with lower current rating may be implemented, but such small-area power devices are typically scaled down versions of mainstream high power devices. This disclosure further relates to devices that are rated at a high blocking voltage of at least around 600V.

According to one general aspect, a semiconductor power device may include a Silicon Carbide (SiC) layer having a power device, such as an active power device, formed on a first surface thereof. The semiconductor power device may include an Ohmic contact layer formed on a second, opposing surface of the SiC layer. The Ohmic contact layer may include Nickel Silicide (NiSix) with a first silicide region containing a first precipitate of non-reacted carbon disposed between the SiC layer and a second silicide region. The second silicide region may be disposed between the first silicide region and a third silicide region, and may include a mixture of a first precipitate of refractory metal carbide and a second precipitate of non-reacted carbon. The third silicide region may contain a second precipitate of refractory metal carbide. The semiconductor power device may include at least one solder metal layer formed on the Ohmic contact layer with the third silicide region disposed between the second silicide region and the at least one solder metal layer. In some implementations, carbon in the third silicide region is included within the second precipitate of refractory metal carbide over at least fifty percent of a contact area of the third silicide region with the at least one solder metal layer.

The details of one or more implementations are set forth in the accompanying drawings and the description below.

Other features will be apparent from the description and drawings, and from the claims.

DETAILED DESCRIPTION

Figure 1A:
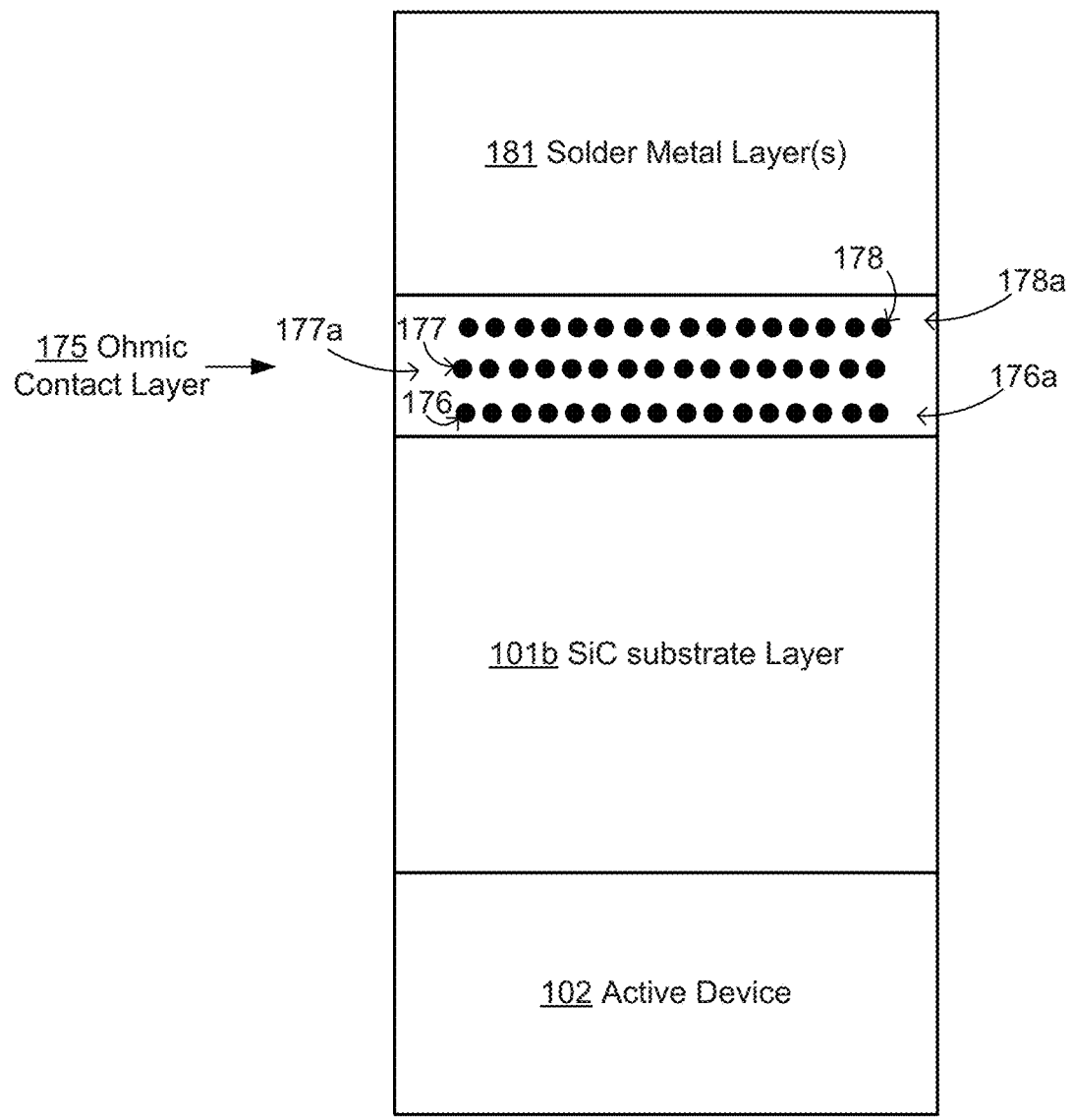
FIG. 1A is a schematic cross-section of a SiC power device.

FIG. 1A is SiC power device structure. In FIG. 1A, a SiC substrate layer 101b is illustrated as having an active device 102 formed on a first surface thereof. As referenced above, and described and illustrated with respect to FIG. 1B, below, the SiC layer 101b may represent a thinned layer of an original, thicker SiC substrate layer 101a.

By way of terminology, the first surface of the SiC layer 101b on which the active device 102 is formed may also be referred to as a frontside or topside surface. Meanwhile, an Ohmic contact layer 175 is formed on a second, opposing surface of the SiC layer 101b, which may thus be referred to as a backside or bottom surface.

As described in detail below, the backside Ohmic contact layer 175 may represent a silicide, such as Nickel Silicide, or Nickel-Vanadium Silicide, formed on the SiC layer 101b. As described herein, formation of such a silicide using silicon from the SiC layer 101b will also typically be accompanied by release and potential diffusion of carbon that is present in the SiC layer 101b.

In FIG. 1A, the backside Ohmic contact layer 175 is constructed with a first silicide region 176a in which carbon precipitates 176 released from the SiC layer 101b are located near the interface of the SiC and the silicide of the Ohmic contact layer 175 (i.e., near the backside surface of the SiC layer 101b). As described herein, the carbon precipitates 176 of the first silicide region may take the form of graphene and/or of graphite, and advantageously serve to lower a contact resistance at the interface between the SiC layer 101b and the silicide of the backside Ohmic contact layer 175. In various implementations, the first silicide region 176a contains little or no refractory metal carbide precipitates.

Further, a second silicide region 177a includes a mixture 177 of metal carbide precipitates and additional precipitates of non-reacted carbon. The metal carbide precipitates of the mixture 177 may be formed through the combination of a refractory metal, such as Titanium, with carbon that has diffused from the SiC layer 101b and through the first silicide region 176a. In this context, non-reacted carbon refers to carbon that has not reacted with the refractory metal during silicidation, and may also be referred to as free carbon.

Further with respect to the backside Ohmic contact layer 175, a third silicide region 178a is illustrated as being adjacent to, and in electrical contact with, one or more solder metal layer(s) 181. As illustrated, the third silicide region 178a generally should not include precipitates of non-reacted carbon. In particular, the third silicide region 178a may contain excessive carbon; however, any such excessive carbon should be fully bound, or nearly fully bound, into refractory metal carbide precipitates 178 on a predominant portion of the contact area. For example, the refractory metal carbide precipitates 178 may occur over at least fifty percent of the contact area. In other implementations, the percentage may be greater than 75%, 90%, or 95%. Similarly, in various example implementations, a percentage of the contact area having free carbon (e.g., precipitates of non-reacted carbon) may be less than 50%, 20%, 10%, or 5%.

As a result, the third silicide region 178a provides a surface with excellent adhesion properties with respect to the solder metal layer(s) 181. As described in detail below, the solderable metal layer(s) are thus capable of withstanding high degrees of thermal and mechanical stress, while maintaining physical and electrical contact with the backside Ohmic contact layer 175.

By way of terminology, the term precipitate should be understood to reference, and include, any cluster, dispersion, crystallite, or non-continuous distribution of the relevant material(s). For example, the metal carbide precipitates of the mixture 177 and the metal carbide precipitates 178 may represent a non-continuous distribution of Titanium carbide (TiC) formed from (at least partially) melted Titanium that has reacted with carbon diffusing from the SiC layer 101b and through the first silicide region 176a and into the second silicide region 177a and the third silicide region n178a. As a result, silicon from the SiC layer 101b is generally free or able to move through the second silicide region 177a and into the third silicide region 178a, to obtain a full and high-quality silicidation of the backside Ohmic contact layer 175.

FIG. 1A is included for the purposes of illustrating and describing the general structure and some of the associated features of the SiC semiconductor power devices described and claimed herein. It should be understood that FIG. 1A is not intended or represented to be drawn to scale for any particular device or type of device, or portions thereof. Specific examples of relevant sizes, thicknesses, and other physical parameters of the elements of FIG. 1A are provided below, or would be apparent to one of skill in the art.

Thus, the general structure of FIG. 1A, along with various techniques for making such a structure and related structures, some of which are described herein, may be used, for example, for any relevant power SiC device. In the present description, including with respect to the following FIGS. 1B-1I, specific examples are provided in the context of Silicon carbide Schottky-diode rectifiers.

Thus, in FIGS. 1B-1I, such rectifiers may be understood to provide an example of the active device 102 of FIG. 1A, formed on a topside of SiC substrate 101a prior to a thinning thereof to obtain SiC substrate layer 101b. In specific testing examples, resulting diode wafers were mechanically thinned down to a total SiC crystal thickness of either 200 µm or 100 µm. Ohmic contact preparation at the wafer backside was executed using deposition of a Ni—V layer with a layer of Ti on top. The resulting backside contact was annealed using a pulsed green laser with a wavelength of 532 nm, after which an additional NiV layer was deposited and laser-annealed, resulting in the Ohmic contact layer 175 with the described silicide regions 176a-178a.

A solder metal, representing an example of the solder metal layer(s) 181, containing a stack of Ti/Ni/Ag was then deposited on top of the Ohmic contact metal. Investigation of the nickel silicide composition has shown the formation of the refractory metal carbides 177, as well as absence of carbon precipitates in the vicinity of the interface of NiSix to the solder metal (i.e., in the third silicide region 178a).

In contrast, laser-sintering pure Ni or of nickel-vanadium has shown substandard adhesion of solder metal to nickel silicide. For example, failure occurred due to peeling of the solder metal as a result of excessive carbon content near the interface of NiSix to the solder metal. Thus, a comparison of the processes and structures described herein to reference processes/structures have been demonstrated to show very clear advantages from the viewpoint of reliability of resulting SiC power devices.

In FIG. 1A, optimum or preferred device thickness from an electrical standpoint is between approximately 8 µm and 50 µm, or, in example implementations, no more than about 280 µm, which is much smaller that of a SiC substrate that can be processed to form the active device structure 102. Typical semiconductor fabrication processes require at least 300 to 350 µm thick wafers. Additional SiC material thickness increases the diode on-state resistance, as well as its thermal resistance.

Figure 1B:
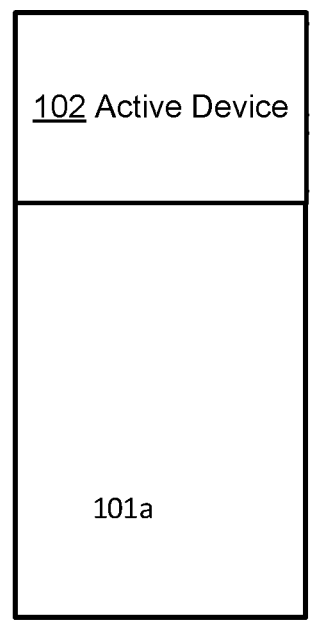
FIG. 1B is a first schematic cross-section of a semi-processed version of the SiC power device of FIG. 1A.
Figure 1C:
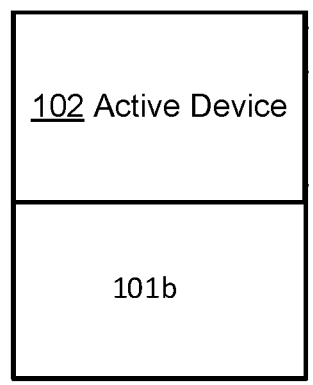
FIG. 1C is a second schematic cross-section of a semi-processed version of the SiC power device of FIG. 1A.

As referenced above, FIG. 1B is a schematic cross-section of a semi-processed device according to one embodiment. A thinning process may be applied to the SiC substrate layer 101a to remove undesired SiC thickness and obtain SiC layer 101b, as shown in FIG. 1C. The thinning process may be mechanical grinding, using a dedicated wafer thinning tool. Mechanical grinding should preferably be completed with polishing to decrease subsurface damage and to obtain a smooth surface of the wafer backside. Mechanical grinding is typically limited by a critical thickness of around 100 µm, below which thickness certain issues can be expected with wafer breakage, at least at today's level of processing.

Mechanical thinning may also be followed by etch. A combination of mechanical grinding with dry etch can achieve much smaller wafer thickness than that available with mechanical grinding alone.

In some examples, the wafer is mechanically thinned to a thickness between approximately 50 µm and 100 µm. Mechanical thinning may result in a certain amount of subsurface damage, which may be still present at the wafer backside, even if the wafer backside is polished at the final stages of the thinning process. The subsurface damage may cause a high risk of wafer breakage, for example, during the stage of substrate removal from the carrier.

Dry plasma etch may thus be applied so as to minimize such subsurface damage by removing at least 5 µm to 15 µm of material from the SiC backside. Removal of at least the first 5 µm is preferably done at a moderate level of power in the etching tool, so as to avoid thermal stress at the wafer during the plasma etch, which thermal stress might increase the probability for development of cracks in the wafer. Removal of subsurface damage may facilitate thinning of the SiC power device substrate to a thickness substantially below 100 µm, without development of cracks in the wafer.

As may be appreciated from the above discussion of FIG. 1A, fabrication of an active device 102, e.g., a power Schottky rectifier wafer, may be finalized by forming a backside Ohmic contact layer 175, and by deposition of the solder metal 181 required for die attach. Accordingly, a cleaned wafer may be placed in a metal deposition tool, in which one or more metal layers are deposited.

Figure 1D:
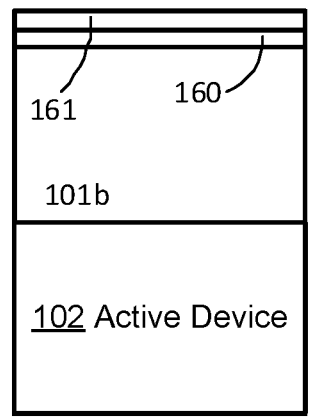
FIG. 1D is a third schematic cross-section of a semi-processed version of the SiC power device of FIG. 1A.
Figure 1E:
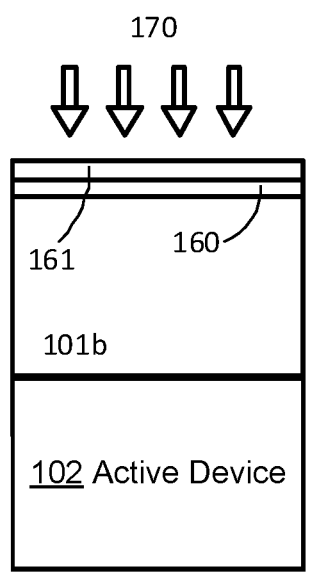
FIG. 1E is a fourth schematic cross-section of a semi-processed version of the SiC power device of FIG. 1A.
Figure 1F:
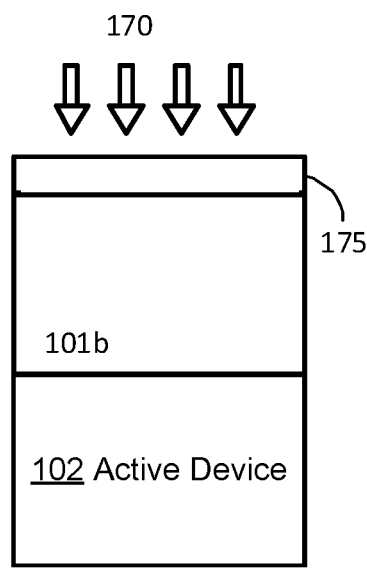
FIG. 1F is a fifth schematic cross-section of a semi-processed version of the SiC power device of FIG. 1A.
Figure 1G:
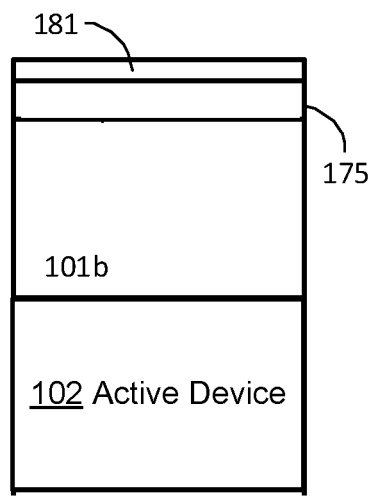
FIG. 1G is a sixth schematic cross-section of a semi-processed version of the SiC power device of FIG. 1A.

For example, as shown in FIG. 1D, a Nickel layer 160 may be deposited in a production magnetron sputtering tool, for which ferromagnetic properties of pure nickel might become an issue. It is typically more convenient depositing nickel with a small percentage of vanadium being added.

Other metal layers can potentially be deposited in the same run. The wafer with deposited nickel-containing layer is transferred to the laser anneal tool, in which the layer is exposed by short pulses 170 with a pulse length of around 100 ns. Typical exposure energy may be, e.g., about 2 J/cm$^2$ for a green (532 nm) laser having a pulse duration of 150 ns and a pulse energy close to 2 J/cm$^2$.

The steps of Ohmic metal deposition and laser anneal may be reiterated one or more times, and the second (or higher) laser anneal 170 may be done with a different laser pulse energy. For example, a Titanium layer 161 (or other refractory metal, as described herein) may be deposited and annealed.

After completing the Ohmic contact process, a solder metal stack may be deposited. The solder metal stack may for example be Ti/Ni/Ag, however other types of solder stacks may be used. Schematic cross-section of finalized device structure is shown in FIG. 1C.

In one aspect, the time of laser-assisted NiSix formation can be as small as between a few nanosecond and 100-200 ns, which time is 9 orders of magnitude shorter than a typical duration of an RTP silicidation process. It may also be the case that an exact temperature of sintering is not measured by direct readings, because direct reading of temperature is difficult at the nanosecond time scale. As a result, a value of peak temperature for laser anneal will generally remain unknown for a typical manufacturing process.

Peak annealing temperature may be estimated through combinations of certain measurements, such as surface reflectivity with computer simulation. Peak nickel silicidation temperature on silicon wafers may occur at about 1400 C, i.e., close to the melting point of silicon, and a temperature that is much higher than that for RTP silicidation of Ni on silicon (e.g., between 400 C and 800 C).

For silicon carbide, RTP silicidation of Nickel occurs at the temperatures that are higher than those for Ni on silicon. In general, peak temperatures for the processes disclosed herein may be at least 1400 C, and may exceed 1600 C, which is about the melting point of Ti (so that Titanium may be partially or completely liquefied when processed as described herein). In addition, laser-assisted processes, including chemical reactions and phase transformation, may be further enhanced by laser light stimulation.

In another aspect, the power device according to this description may be a three-terminal silicon carbide power device utilizing a thinned SiC substrate. A three-terminal device may for example be a silicon carbide field-effect transistor, for example, a SiC MOSFET, or a SiC JFET. Alternately a three-terminal device may be a bipolar, such as a BJT or an IGBT, or a thyristor formed in SiC. Design and process of the backside contact for said three-terminal SiC power devices may be identical to those for a rectifier. It must be clear for those skilled in the art that the frontside bonding wires to a three-terminal device must be more than one, and said bonding wires may be typically more than two, so as to accommodate high on-state current of said power device without excessive parasitic resistance, as well as to minimize parasitic lead inductance.

In another aspect, a silicon carbide power device chip manufactured according to this description may be mounted as a component of a power module. A power module is often assembled on direct copper-bond (DCB) substrate, in which the copper layers are bonded to an insulating ceramic substrate. A DCB substrate is populated with desired semiconductor chips, which may be attached to its top metal layer by soldering or using a diffusion solder technique, or by another method. The set of semiconductor chips mounted in a module may for example, be entirely composed of thinned silicon carbide power devices manufactured according to this disclosure.

Alternatively, silicon carbide power devices may be combined with silicon power devices, as well as with other elements intended to be part of a power module. Topside power device terminals are wire-bonded or connected by some other technique. The power module is then potted using a silicone rubber or using EMC to isolate the power devices from environmental effects. The power module may be further used as a subcircuit of a power conversion device.

Improved integrity of the backside contact for thinned SiC power devices according to this description will have positive effect on device reliability. In some implementations a low-cost power module utilizing SiC power devices according to this invention may be assembled in an EMC-mould module containing no ceramic substrate. Semiconductor devices in such low-cost power device module are attached to a leadframe, and electrical insulation of desired parts of the module is provided by the EMC.

In one aspect, SiC power device suitability of the SiC power device is verified through a set of qualification tests as set by JEDEC (Joint Electron Device Engineering Council) and/or by AEC (Automotive Engineering Council). The referenced set includes multiple tests, of which the test most relevant to the backside contact integrity is thermo-mechanical cycling (TMCL), as referenced above. The TMCL test content may depend on the package type.

In the remaining description, a process of reference (referred to as "POW") provides a comparison(s) for the various disclosed embodiments, such as those described above, as well as the more specific example processing options of FIGS. 3A-5, below. More specifically, the process-of-reference (POR) Ohmic contact process includes a single cycle of Ni—V deposition and a laser anneal for silicidation. Specific example results of the POR process are described and illustrated below, e.g., with respect to FIGS. 7A-7C.

In general, the POR process was found to result in failed TMCL tests for through-the-hole packages, unless the deposition of solder metal was preceded by prolonged pre-sputtering. Prolonged pre-sputtering of the annealed NiSix surface prior to solder metal deposition resulted in no failures for through-the-hole packages. However, the same die mounted in SMT packages failed the TMCL test. Substitution of pure Ni for Ni—V in the Ohmic contact layer did not result in statistically significant improvement.

Figure 2:
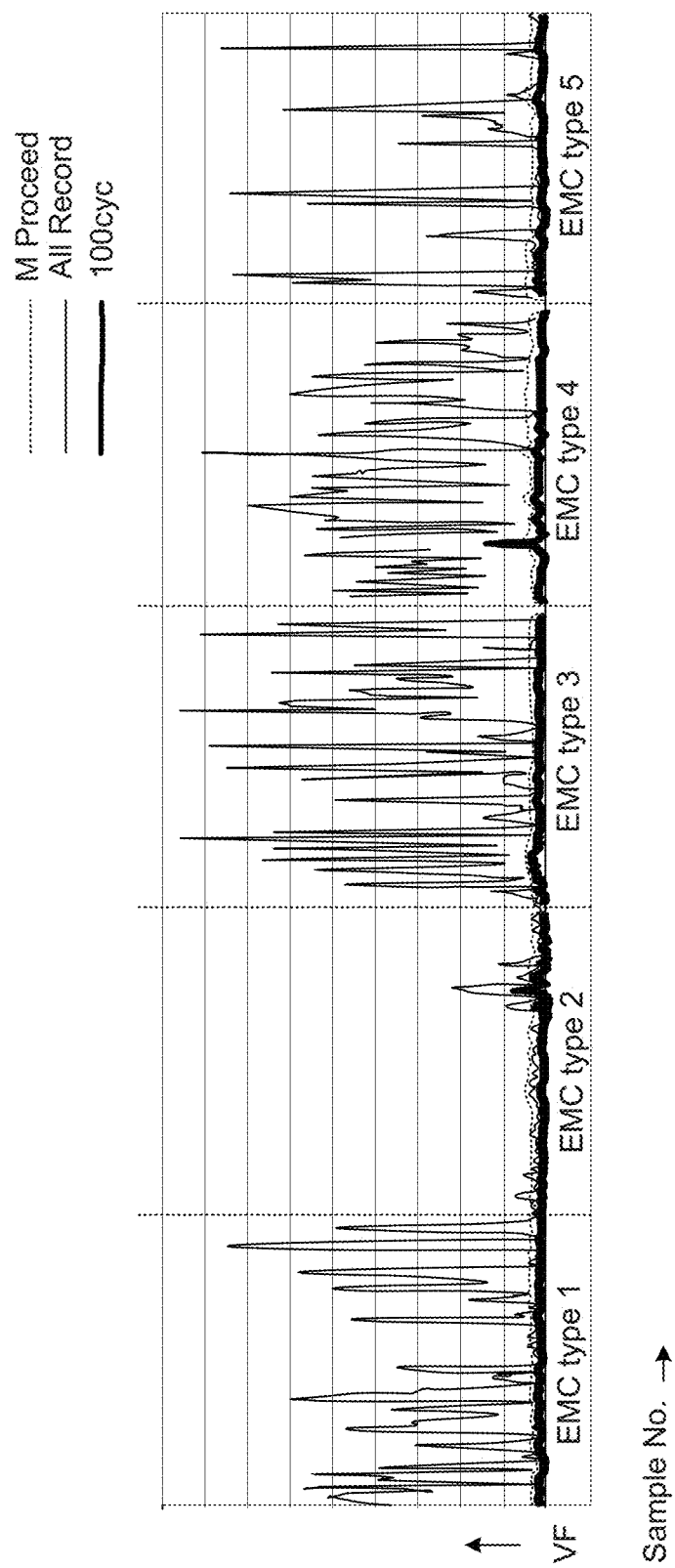
FIG. 2 is a graph illustrating a drift of forward drop after thermo-mechanical cycling for a reference process as a function of die number.
Figure 3:
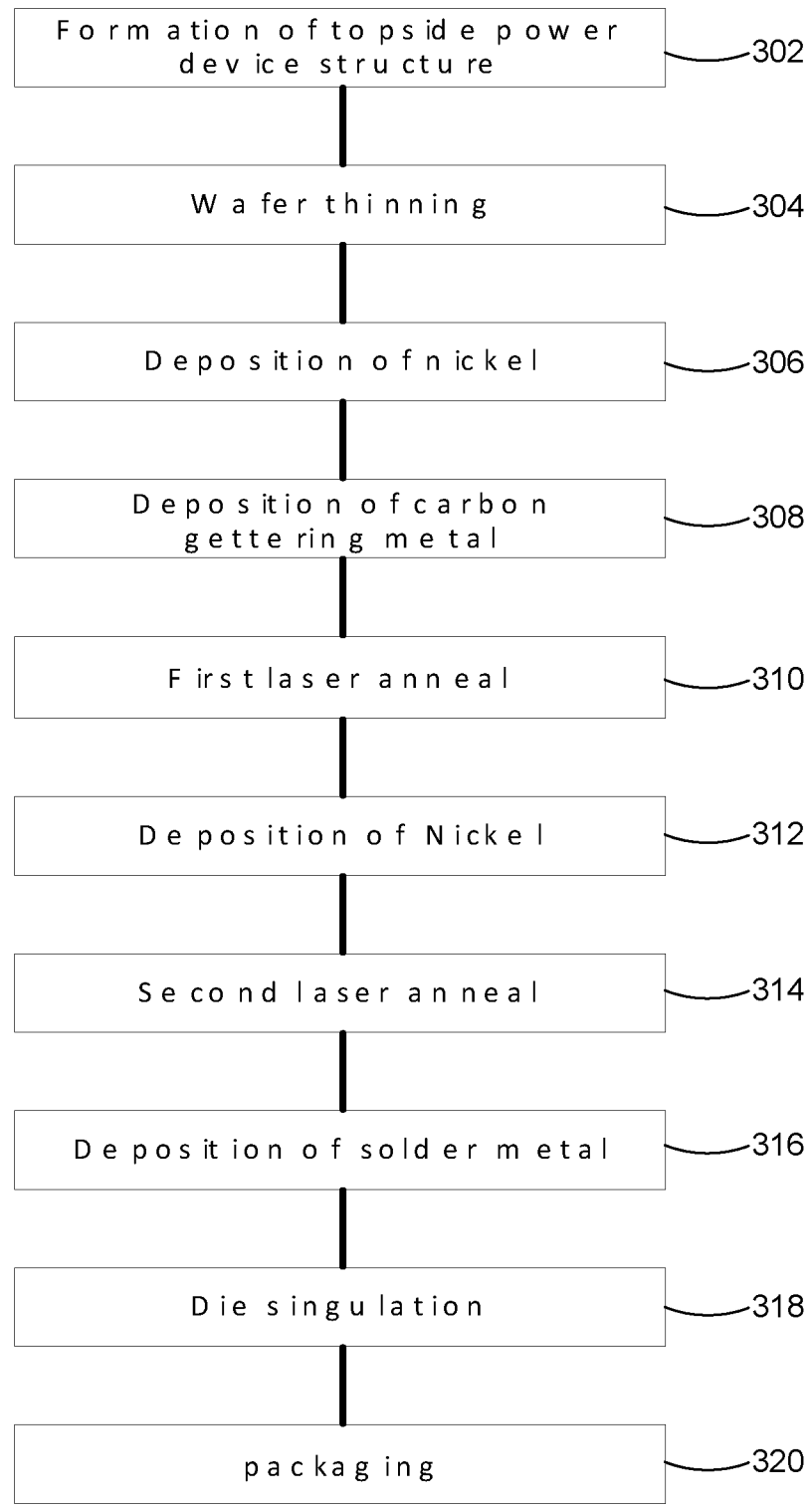
FIG. 3 is a flowchart illustrating a first example embodiment for forming the semiconductor power device(s) of FIGS. 1A-1G.

FIG. 2 shows the distribution of the values of the diode forward drop at rated current (VF) after preconditioning plus 100 cycles of TMCL. The values of VF prior to testing are also shown for comparison. All the values of VF are plotted as a function of the sample number. In FIG. 2, four different plots correspond to five different types of the EMC employed in packaging. A pronounced change in VF indicates a start of die delamination from the heat sink, which was verified by failure analysis. The amount of failures was strongly dependent on the type of the EMC applied; however, no batch of 77 parts could successfully pass the 1000-cycle TMCL test as preceded by preconditioning, irrespective of which type of EMC was employed.

Failure analysis was performed to identify exact location of delamination, and the failure analysis indicated that die delamination occurs exactly along the interface of the NiSix contact to the solder metal, which was established through X-ray emission analysis of the residues on the SiC chip after delamination. Thus, the failure analysis substantiates the discussion above with respect to FIG. 1A, e.g., that presence of free carbon near the NiSix/solder metal interface results in a rough surface and poor adhesion properties.

FIG. 3A is a flowchart illustrating a first option for a semiconductor fabrication process in accordance with the present description. In FIG. 3A, formation of a topside power device structure (302) is followed by wafer thinning (304), as described above. Deposition of nickel (or nickel alloy, such as NiV) (306) is followed by deposition of a carbon gettering material, such as a refractory metal, e.g., Titanium (308).

A first laser anneal is then performed (310), followed by deposition of a second layer of Nickel (312). A second laser anneal (314) is followed by deposition of one or more solder metal(s) (316). Die singulation may then be performed (318), followed by suitable packaging of the device formed (320).

By way of more specific example of option 1 of FIG. 3A, an Ohmic contact may be formed by depositing a 50-nm layer of titanium in between the two layers of the nickel to be laser-annealed. A 70-nm layer of Ni—V and a 50-nm layer of Ti may be deposited onto the backside of a SiC power rectifier wafer mechanically thinned down to 100 um. Laser annealing of the contact may be performed using a green (532 nm) pulsed laser with a pulse length of around 140 ns, with a pulse having an energy of 2 J/cm$^2$.

After the first annealing, an additional 70 nm of Ni—V may be deposited, after which the second laser anneal may be executed. A solder metal stack of Ti/Ni/Ag may then be applied to the backside of the wafer.

Device wafers using design and process according to Option 1 were diced, and packaged in D2PACK packages, and subject to preconditioning and to the thermomechanical cycling (TMCL) of 1000 temperature cycles from −55 C and 150 C. The test conditions and the tested lot size (77 devices) were identical to those applied to the devices processed and tested according to the process of reference (POR). No occasions of forward voltage drift or other device failures were observed, which is a dramatic difference from the test results according to results of the process of reference (already described with respect to FIG. 2).

Figure 4:
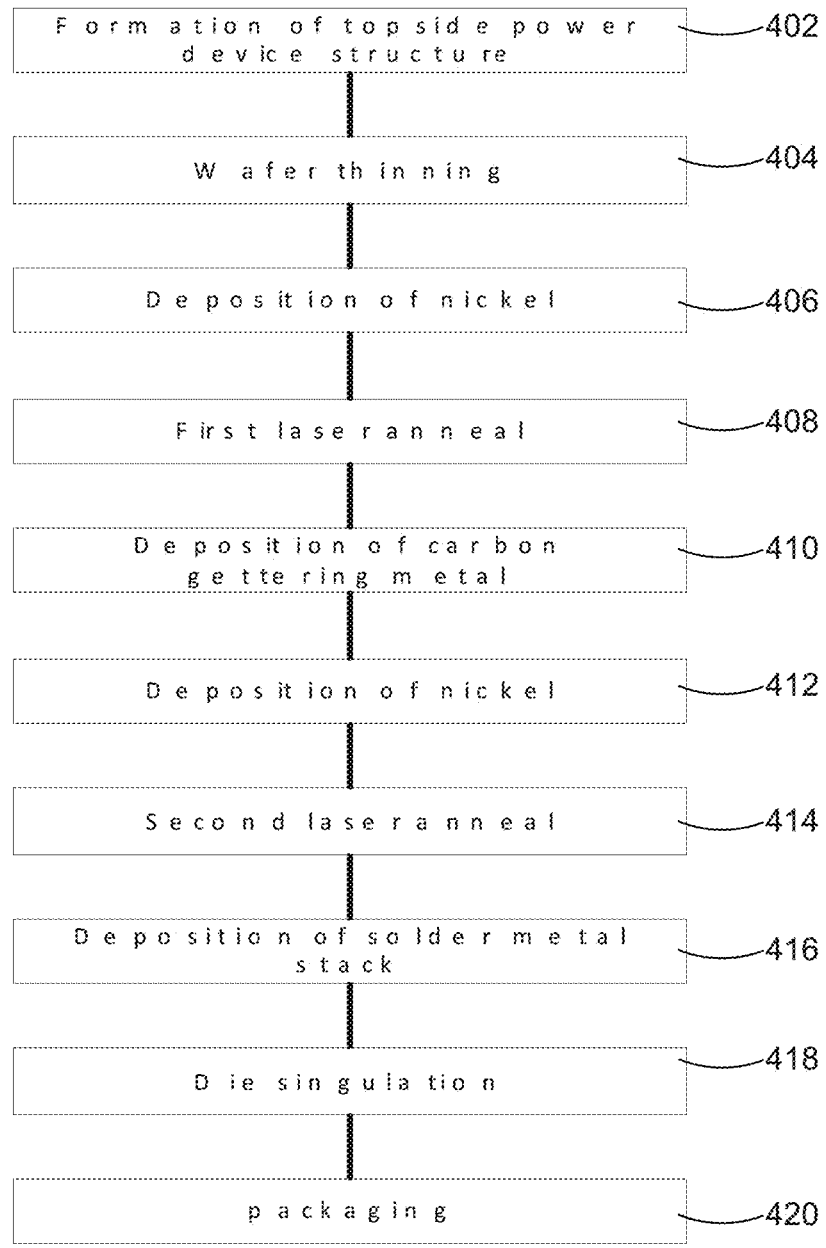
FIG. 4 is a flowchart illustrating a second example embodiment for forming the semiconductor power device(s) of FIGS. 1A-1G.

FIG. 4 is a flowchart illustrating a second option for a semiconductor fabrication process in accordance with the present description, referred to herein as Option 2. In Option 2, topside power device formation (402), wafer thinning (404), and nickel deposition (406) are followed directly by a first laser anneal (408).

Then, the deposition of a carbon gettering material, such as Titanium, may proceed (410), followed by a second deposition of Nickel (412) and a second laser anneal (414). Afterwards, the process of FIG. 4 may proceed similarly to that of FIG. 3A, with a deposition of a solder metal stack (416), die singulation (418), and packaging (420).

By way of more specific example with respect to Option 2 of FIG. 4, an Ohmic contact may be formed by depositing a 50-nm layer of titanium in between the two layers of the nickel to be laser-annealed. A 70-nm layer of Ni—V may be deposited onto the backside of a SiC power rectifier wafer mechanically thinned down to 100 um. Laser annealing of the contact may be performed using a green (532 nm) pulsed laser with a pulse length of around 140 ns, the pulse having an energy of 2 J/cm$^2$.

After laser annealing, an additional 50 nm thick Ti layer and a 70 nm of Ni—V may be sequentially deposited, after which the laser anneal may be repeated. A solder metal stack may be implemented as Ti/Ni/Ag, which may then be applied to the backside of the wafer.

Device wafers using design and process according to Option 2 were diced, and packaged in D2PACK packages, and subject to preconditioning and to the thermomechanical cycling (TMCL) of 1000 temperature cycles from −55 C and 150 C. The test conditions and the tested lot size (77 devices) were identical to those applied to the devices processed and tested according to the process of reference and to the devices using process Option 1. No occasions of forward voltage drift or other device failures were observed.

Figure 5:
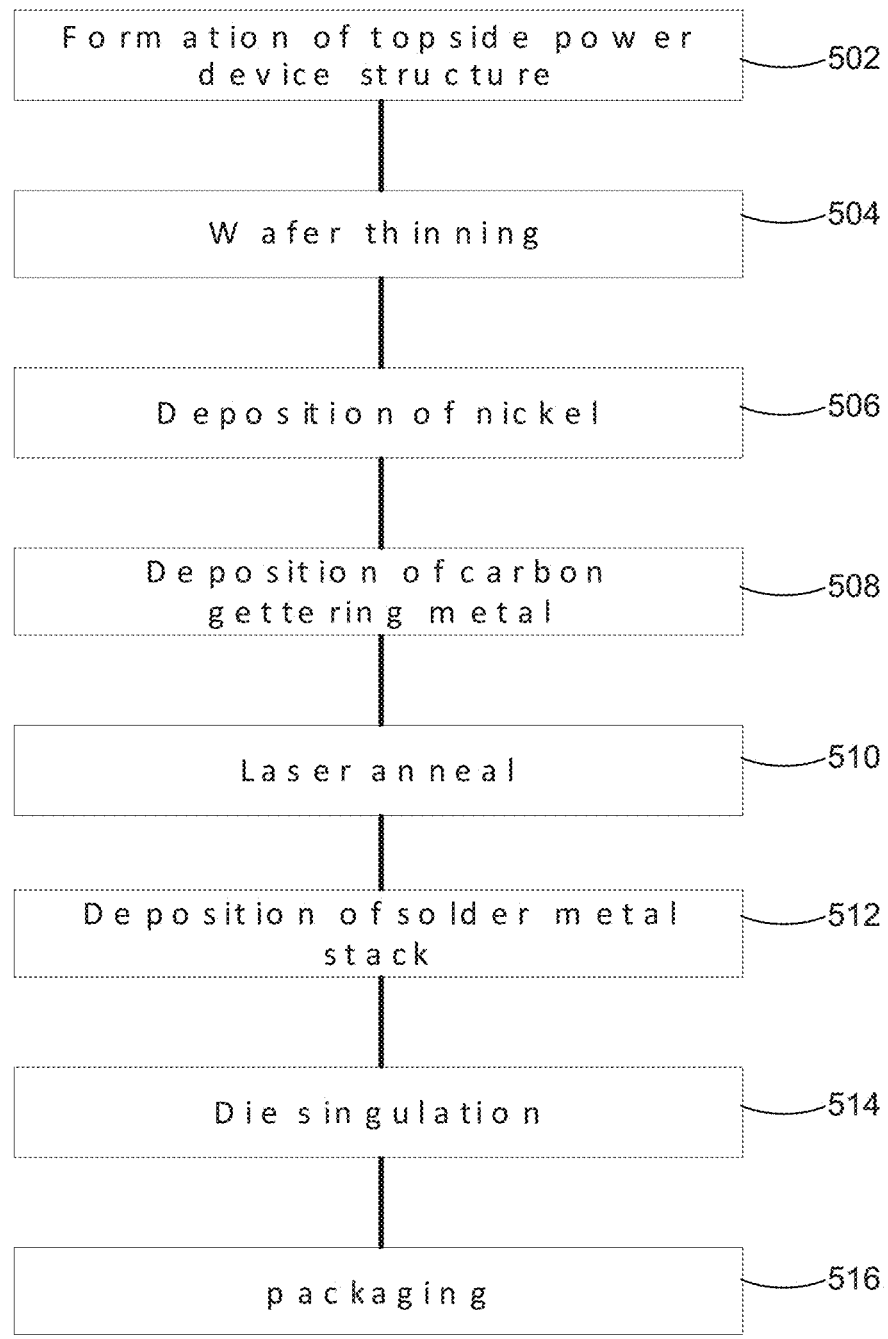
FIG. 5 is a flowchart illustrating a third example embodiment for forming the semiconductor power device(s) of FIGS. 1A-1G.

FIG. 5 is a flowchart illustrating a third option for a semiconductor fabrication process in accordance with the present description, referred to herein as Option 3. As shown and described, Option 3 of FIG. 5 requires only a single laser anneal. Specifically, topside power device structure formation (502) is followed by wafer thinning (504), and then nickel deposition (506) and deposition of an appropriate carbon gettering material (508). Then, a single laser anneal is performed (510). Solder metal stack deposition (512), die singulation (514) and packaging (516) may then proceed.

In a specific implementation of Option 3 of FIG. 5, an Ohmic contact may be formed using a single cycle of metal deposition and laser anneal, in which a 70-nm layer of Ni—V and a 50-nm layer of Ti are sequentially deposited onto the backside of a SiC power rectifier wafer that was mechanically thinned down to 100 um. Laser annealing of the contact may be performed using a green (532 nm) pulsed laser with a pulse length of around 140 ns, with a pulse having an energy of 2 J/cm$^2$. A solder metal stack of Ti/Ni/Ag may then be applied to the backside of the wafer.

Device wafers using design and process according to Option 3 were diced, and packaged in D2PACK packages, and subject to preconditioning and to the thermomechanical cycling (TMCL) of 1000 temperature cycles from −55 C and 150 C. The test conditions and the tested lot size (77 devices) were identical to those applied to the devices processed and tested according to the process of reference and to the devices using process Option 1 or Option 2. No occasions of forward voltage drift or other device failures were observed.

Thus, a nickel silicide contact formed using laser anneal with carbon gettering, such as described above with respect to FIGS. 3A-5, may form an interface to the solder metal with sufficiently strong adhesion to prevent delamination along the solder metal. Two types of test may be applied to verify such solder metal adhesion, e.g., the die shear test and adhesion tape test.

In a further aspect, the SiC power device utilizing a laser-annealed backside nickel silicide formed with a carbon gettering layer (as in FIGS. 3-5) has a low contact resistance, which does not significantly contribute to the on-state voltage drop. An example specific contact resistance required to achieve this goal is preferably below 0.1 mOhm*cm$^2$.

Thus, one requirement to backside contacts for many types of SiC devices is low specific contact resistance. For example, SiC rectifiers with 650V blocking voltage rating may have a specific on-state resistance below 1 mOhm*cm$^2$ as of today. A specific contact resistance of 0.1 mOhm*cm$^2$ will introduce more than 10% of additional resistance, which is undesired. Yet lower values of specific on-state resistance are expected for future SiC devices, which requires contacts with specific resistance of substantially below 0.1 mOhm*cm$^2$.

Table 1 shows results for wafer tests of 4 power rectifier wafers. All die had a nominal on-state current of 10 Amp and a nominal blocking voltage of 650V. Actual blocking voltage was a higher value in order to provide required safety margin. Wafers W1 and W2 were manufactured using the reference process (POR). Wafer W3 was done with the new process Option 2 of FIG. 4, and W4 was done with new process Option 1 of FIG. 3A. The rectifiers have a high current density of over 630 A/cm$^2$, which is why their forward drop must be affected by additional contact resistance if such resistance is substantially high. The values of mean forward drop and mean VF are provided in Table 1, and the trend is plotted in FIG. 6.

TABLE 1

| wafer | Mean VF (V) | Mean BV (V) |
|---|---|---|
| W1 | 1.349 | 766 |
| W2 | 1.394 | 819 |
| W3 | 1.357 | 780 |
| W4 | 1.368 | 784 |

Figure 6:
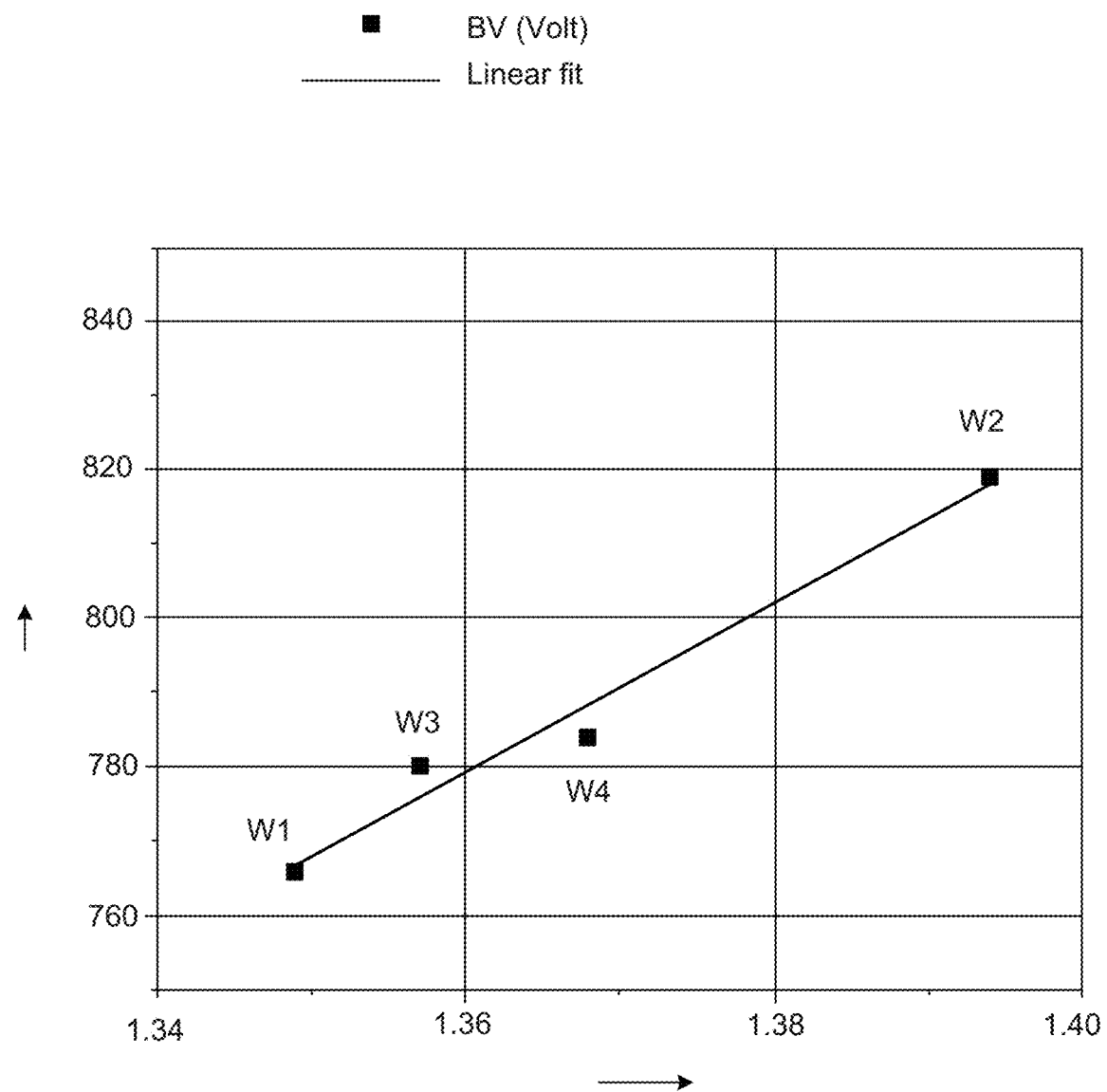
FIG. 6 shows a trend line for dependence of mean BV on mean VF for 4 wafers investigated.

In FIG. 6, the trend line for dependence of mean BV on mean VF for 4 wafers shows that the dependence of all 4 wafers tested approximately fall onto the same tradeoff dependence between mean breakdown voltage on mean forward drop. Therefore, the process modification does not have significant effect in total voltage drop of the power rectifier. A contact resistance of 0.1 mOhm cm$^2$ for any process option would shift the forward bias at the rated current density of 630A/cm$^2$ by 63 mV, which shift from the trend line are clearly not present in FIG. 6. A shift of 63 mV will exceed an entire span of the voltage axis of the plot shown in FIG. 6, which is clearly not the case. The contact resistance for different process options is therefore substantially below 0.1 mOhmcm$^2$. The test data for rectifier devices formed using Option 3 of FIG. 5 (that is, a single cycle of metal deposition and laser anneal) also indicate a low forward voltage drop, identical to Option 1, for which the contribution of the Ohmic contact does not affect the forward drop of a rectifier at a current density of around 630 A/cm$^2$.

Figure 7A:
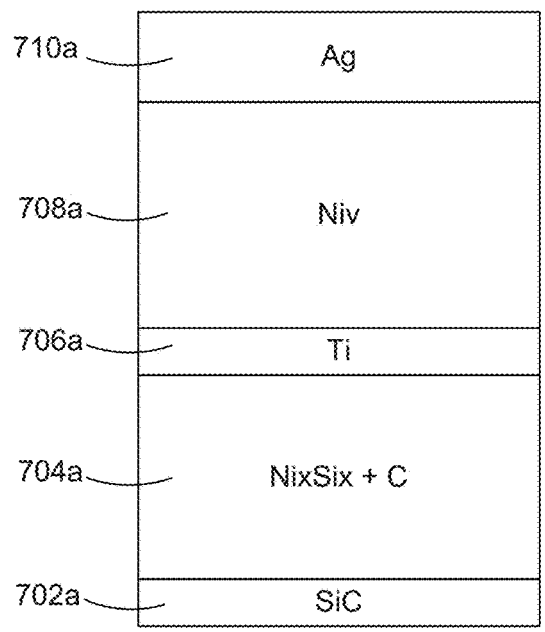
FIG. 7A shows a schematic cross-section of a laser-annealed NiSix contact formed according to a reference process.
Figure 7B:
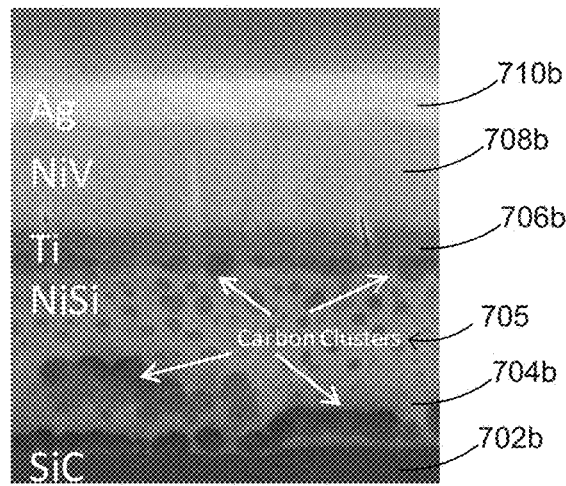
FIG. 7B shows an electron micrograph of a laser-annealed NiSix contact formed according to the reference process of FIG. 7A.
Figure 7C:
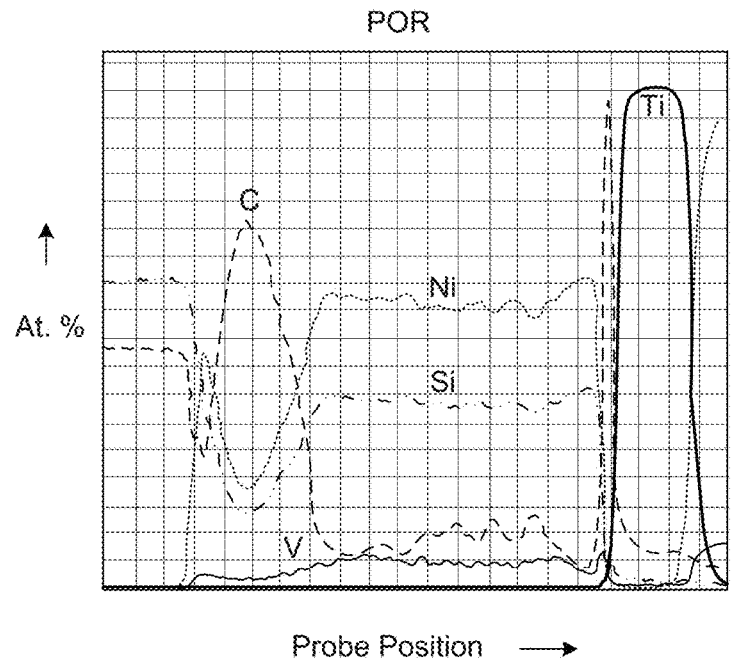
FIG. 7C shows a composition of a laser-annealed NiSix contact formed according to the reference process of FIG. 7A.

As referenced above, FIGS. 7A-7C illustrate the results of a scanning transmission electron microscopy (STEM) analysis performed to analyze the contact cross-sections 702a-710a of a SiC power device formed using one of the POR processes. Specifically, FIGS. 7A-7C illustrate a schematic cross-section (FIG. 7A), electron micrograph (FIG. 7B), and composition of laser-annealed NiSix contact (FIG. 7C).

As shown in FIG. 7A, layer 702a is a SiC layer, Ohmic contact layer 704a is a NiSix layer with dispersed carbon throughout, and layers 706a, 708a, 710a represent a solder metal stack of Ti/NiV/Ag, respectively. Corresponding reference numerals 702b-710b refer to the corresponding STEM image.

As may be seen in FIG. 7B, considerable amounts of carbon precipitates are present in the bulk of the NiSix Ohmic contact metal 704b. The carbon clusters or precipitates are present near the SiC-to-NiSix interface, in the bulk of NiSix and at the top surface of NiSix, i.e. near the interface to the solder metal.

A high peak of carbon content is also visible on the elemental profiles of layer composition near the NiSix-to-solder metal interface, as shown in FIG. 7C. As described, this peak is particularly undesirable, because it implies roughness of that interface and associated lack of adhesion. POR samples having pure Ni as a source of NiSix formation (instead of NiV) showed similar near-interface peaks of carbon and similar problems with reliability. The NiSix composition in this case is in a proportion of about 62/38, which corresponds to a composition of NiSix of approximately Ni$_3$Si$_2$.

Figure 8A:
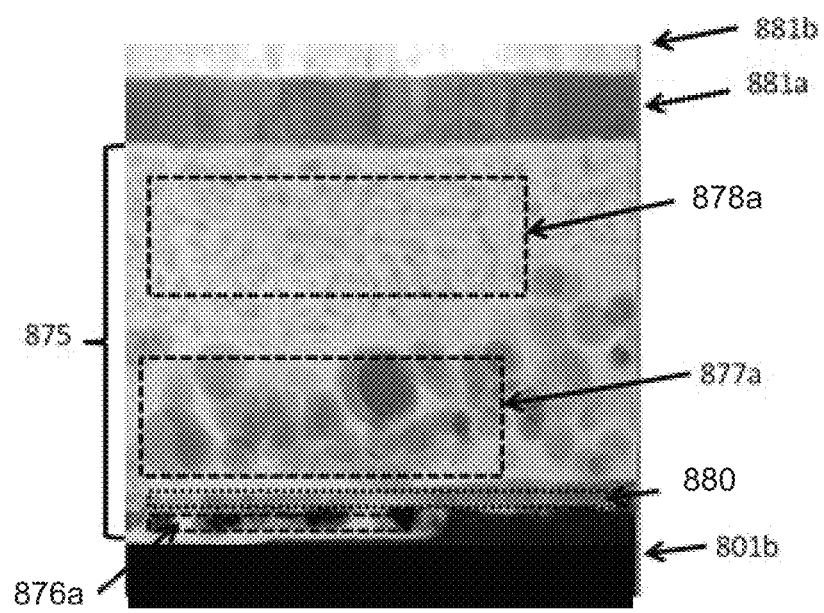
FIG. 8A shows an electron micrograph of a laser-annealed NiSix contact formed using carbon gettering according to an example embodiment.
Figure 8B:
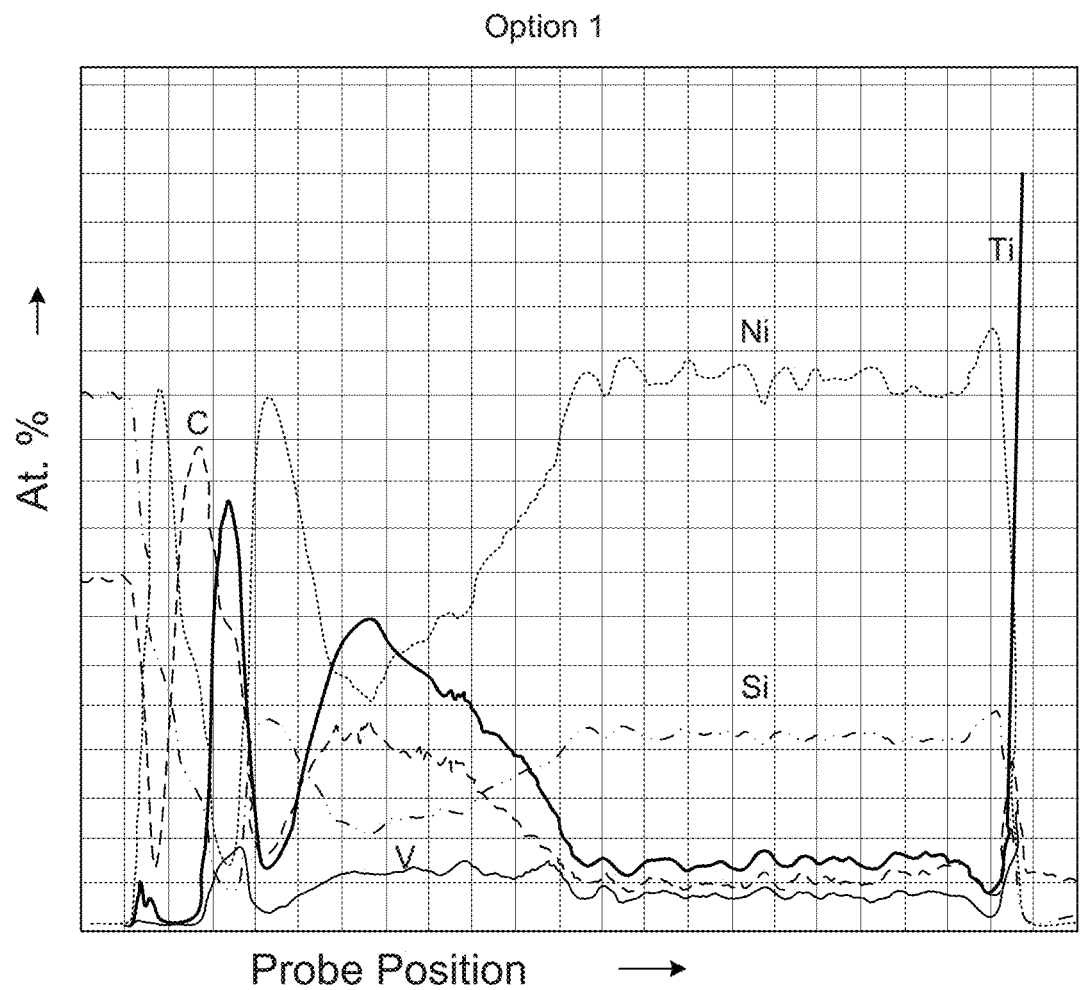
FIG. 8B shows a composition of a laser-annealed NiSix contact formed using carbon gettering according to the example embodiment of FIG. 8A.

In contrast, FIG. 8A is a STEM image that corresponds generally to the structure of FIG. 1A. FIG. 8A corresponds to a structure formed using Option 1 of FIG. 3A, in which the carbon gettering layer of Ti is provided before the first laser anneal. FIG. 8B provides line scans of elemental composition in a vertical direction.

FIG. 8A illustrates the silicide of the Ohmic contact layer 875, corresponding to layer 175 of FIG. 1A. Further, carbon precipitates are illustrated as being present in a region 876a, near the interface of NiSix to SiC, and corresponding to the first silicide region 176a of FIG. 1.

A mixture of large carbon precipitates (or clusters) and non-reacted carbon is formed in the region 877a, which is above the region 876a and corresponds to the second silicide region 177a of FIG. 1A. More particularly, in this region 877a, free or non-reacted carbon may be found, but such carbon within the bulk silicide of the second silicide region 877a is generally not detrimental to the contact and surface properties of the interface between the layer 875 and the solder metal stack 881a/b.

Figure 8C:
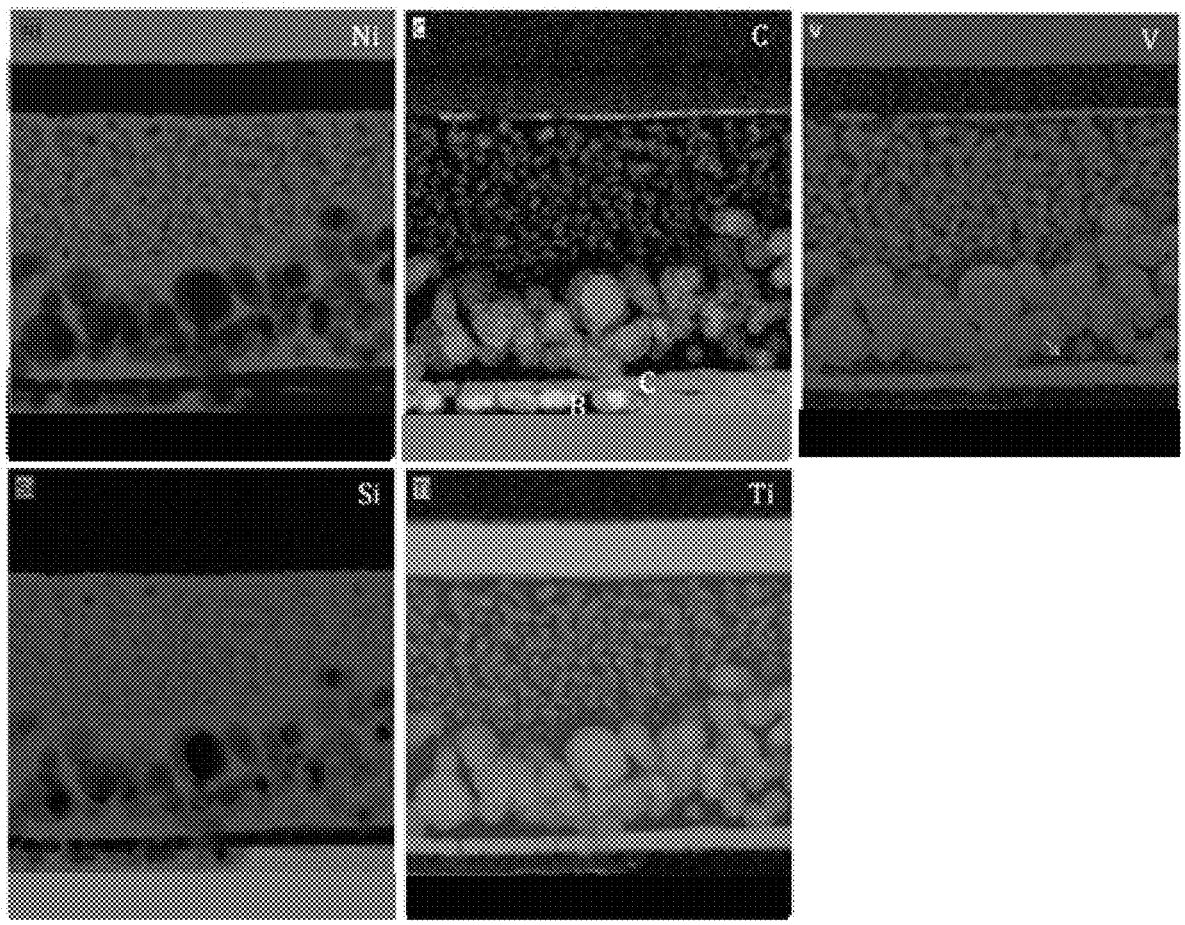
FIG. 8C shows element-contrast Scanning Transmission Electron microscopy images of Nickel Silicide contact for nickel, carbon, vanadium, silicon, and Titanium for the example embodiment of FIGS. 8A and 8B.

In contrast STEM images (in which heavier elements show brighter contrast), such as FIG. 8C (in which a corresponding element symbol is included in the upper right corner of each image), it may be observed that a bright contrast of carbon fully correlates with the contrast of Ti. In such images, a bright contrast of carbon and of titanium is correlated in region 877a with dark contrast of nickel and silicon, which indicates the agglomerations of Ti and Ni are precipitates. The bright contrast of Ti also correlates with the bright contrast of vanadium, though V is in lower concentration than Ti. The carbon agglomerations in region 877a are therefore precipitates of carbides of titanium, and, partially, of vanadium.

A continuous layer of Ti is no longer present in the region 877a. This is consistent with partial or complete melting of the Ti as described above, and/or related to diffusion of Ti combined with solid-state reaction.

Formation of TiC occurs also in region 878a, corresponding to the third silicide region 178a of FIG. 1, which is predominantly formed during the second laser anneal of FIG. 3A. However, the mean TiC particle size in this region is smaller than that for region 874a. As may be observed from the type of contrast STEM images referenced above, a contrast pattern of vanadium closely follows that of carbon and of titanium throughout the regions 877a and 878a, indicating that formation of vanadium carbide occurs in the same locations as formation of titanium carbide. However, such formation of vanadium carbide is insufficient to address and correct the stability and adhesion concerns addressed herein through the use of the additional carbon gettering refractory metal, such as Titanium. Put another way, inclusion of a first refractory metal, such as Vanadium, with the Nickel of the NiSix layer (e.g., for purposes of facilitating silicidation processing, as referenced herein), is not sufficient to form the silicide structure described herein, including the first, second, and third silicide regions, nor to address the stability and adhesion concerns described herein. However, as also described herein, inclusion of the second refractory metal, such as Titanium, in the manners described herein, is sufficient to create the described distributions of reacted and non-reacted carbon through the NiSix layer 175/875.

A TiC-rich layer 880 is also present near interface of the Ohmic contact layer 875 and the SiC substrate 801b. This near-interface TiC layer may potentially and/or partially block formation of the carbon precipitate layer 876a, as is visible for the right-hand part of the cross-section shown in FIG. 8A. Such blocking of formation of the interfacial carbon-precipitate layer 876a is undesirable, because it may increase the contact resistivity, as described above with respect to FIG. 1A.

The use of too thick a gettering Ti layer (e.g., layer 161 in FIG. 1) may undesirably deteriorate the contact resistance due to early formation of the TiC layer 880. To mitigate or avoid this outcome, the thickness of the gettering layer 160 may be kept less than or equal to the thickness of the nickel layer 160.

Further, the same deterioration of contact properties may happen if the Ni layer 160 is too thin, resulting in excessively fast migration of Ti towards the SiC substrate during anneal. The thickness of Ni (or Ni—V) may be maintained in excess of approximately 20 nm to avoid the increase of the Ohmic contact resistance.

Thus, carbon concentration in region 876a is designed to be independent of the Ti that was included in the carbon gettering layer of Ti originally placed on the first Nickel layer of FIG. 3A. In other words, the interfacial carbon layer 876a that is at least partially responsible for contact resistance of the Ohmic contact layer 875 may be formed substantially as if the gettering layer 161 was not present, while still obtaining all of the advantages of the gettering layer 161.

Finally with respect to FIGS. 8A and 8B, it may be observed that NiSix composition resulting from process Option 1 of FIG. 3A corresponds to $Ni_3Si$. Composition of NiSix of the POR reference process is $Ni_3Si_2$. NiSix composition is discussed in greater detail, below.

Figure 9:
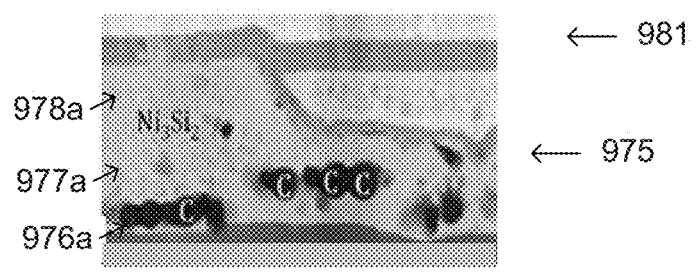
FIG. 9 shows an electron micrograph of a NiSix contact according to an example embodiment.

FIG. 9 shows a STEM image of a cross-section of a NiSix Ohmic contact layer 975 formed using Option 2 of FIG. 4. Marked in the STEM image are the locations of precipitates of free carbon ("C"), as well as the NiSix composition measured ($Ni_3Si_2$). This composition may be compared to the POR ($Ni_2Si_3$), and is different from Process Option 1 ($Ni_3Si$).

Free carbon is present in the layer in lower part of the NiSix layer in a region 976a. However, in higher regions 977a, 978a of the NiSix layer, element-resolved STEM images show bright contrasts correlating to elemental images of carbon, titanium and vanadium, indicating gettering of carbon into titanium carbide, and, partially, into vanadium carbide.

Figure 10:
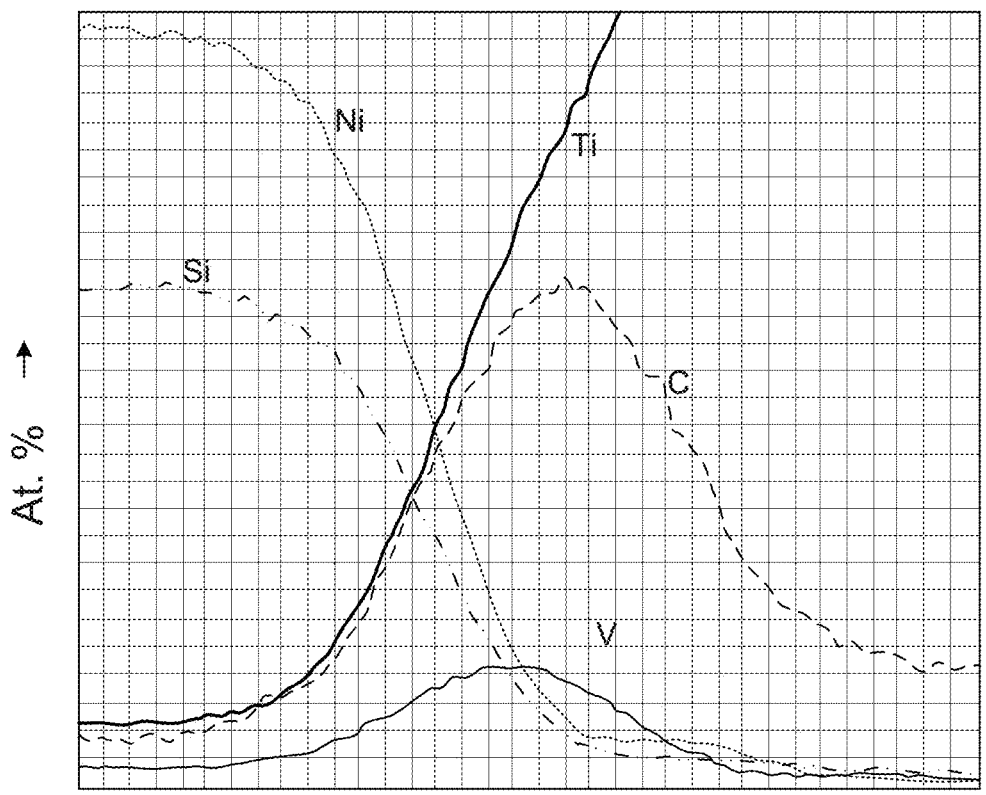
FIG. 10 shows a high resolution scan of Ohmic contact composition of the embodiment of FIG. 9.

High-resolution scans were taken near the interface of NiSix to the solder metal 981, and an example of such a scan is shown in FIG. 10. The x-coordinate of the scan in FIG. 10 increases in the direction from the Ohmic metal contact layer 875 to the solder metal 881. The ratio of nickel to silicon in the Ohmic metal is approximately 3:2, which is close to the Ni/Si ratio due to the POR process. The solder metal portion examined in this analysis corresponds to Ti, which is the first layer of the Ti/Ni/Ag solder metal stack. The scan shows increased carbon content near the interface, where this carbon is bound into carbides, which binding is clear from FIG. 10. The carbon content stays below the content of Ti. In addition, an accumulation of vanadium is also observed at the same position as is the peak of carbon concentration.

One conclusion from structural investigation of the NiSix Ohmic contact layer 175, 875, 975 is that neither a short annealing time of, e.g., 140 ns nor a high temperature of around or above the melting point of Ti present an obstacle for efficient gettering of excessive carbon in the course of laser annealing. Another conclusion is that addition of other metals having high affinity to carbon can be used for gettering excessive carbon in the NiSix laser-annealed contacts to SiC. Vanadium represents one example of such a metal, as referenced above. Other metals like W, Mo, or Ta can be used as well. Silicides of such metals can potentially be used as a substitute to pure metals. Further, the refractory metals applied need not necessarily be limited to heavy elements. For example, titanium diboride may be employed as a carbon getter. Boron will also react with carbon to form boron carbide, $B_4C$.

In one aspect, as described herein, a top surface of annealed Nickel silicide should preferably not contain any free carbon, as free carbon might impact reliability of solder metal adhesion. The top surface of the nickel silicide contact may have increased carbon content; however, such increased carbon should preferably be bound into refractory metal carbides, as is the case with the examples for composition profiles of Options 1 and 2. Precipitates (or clusters) of non-reacted carbon may indeed be present in the bulk of the nickel silicide contact layer without any adverse affect on contact reliability (e.g., the second silicide region 177a/877a), as is the case for Option 2 of FIG. 4. However, the structure of nickel silicide according to Option 2 is free from precipitates of non-reacted carbon for the third silicide region 178a/878a, adjacent to the solder metal, which adjacent region is the most critical for adhesive properties of the solder metal. Thickness of the adjacent region 178a/878a should be at least approximately 10 nm in order provide a possibility for some etchback of the silicide without reaching precipitates of non-reacted carbon within the second silicide region 177a/877a as a result of such etchback. In some cases the layer of refractory metal carbide at the interface of the nickel silicide to the solder metal may be absent in completed SiC power device according to some embodiments. Such an interfacial carbide layer at said interface might, for example, be at least partially removed during an in situ etchback preceding deposition of the solder metal stack.

It is possible that the second silicide layer 177/877 contains precipitates of free carbon only in a lower part thereof, e.g., representing the transition from the first silicide region 876 to the second silicide region 877 (e.g., as may occur in the case of Option 1 of FIG. 3A, as represented in FIG. 8A/8C). In other words, the transition from the first silicide region 176/876 to the second silicide region 177/877 may not necessarily have a sharp boundary, and a certain portion of carbon precipitates in the bulk of nickel silicide would belong to the second layer of silicide.

In various implementations, boundaries for preferred amounts of the carbon gettering metal, and/or for preferred location of such metal prior to the laser anneal, may exist. Some of those boundaries are disclosed above, e.g., in relation to the embodiment related to process Option 1 of FIG. 3A. The carbon gettering metal should preferably not be placed next to the interface with SiC, due to the possibility of suppression of carbon precipitate formation next to the SiC surface, which suppression may increase the contact resistance. In general, it has been shown that Ohmic contacts to heavily n-doped SiC substrates utilizing contacts of pure nickel have 10 to 100 times lower specific resistance, due to formation of interfacial free carbon, which free carbon has a very low barrier height to n-type SiC.

It is preferred that the gettering metal be separated from SiC surface by at least 10 nm to 20 nm of nickel. Minor amounts of the gettering metal under 10% to 15% may be still be present as additions to the Ni layer deposited onto the SiC surface prior to laser anneal, which possibility is demonstrated by the role of Vanadium in 3 process options disclosed above. The above description demonstrates the significance of spacing away the gettering metal by a layer of nickel of sufficient thickness.

Thus, carbon gettering material that is too thick and/or placed too closely to the SiC/NiSix interface may inhibit formation of the interfacial carbon cluster region (176a, 876a, 976a) that are at least partially responsible for Ohmic properties of the contact. On the other hand, too low of an amount of the gettering metal will allow too much free carbon within the regions 177a, 877a, 977a, as well as near the interface of the NiSix layer and the solder metal layer, i.e., regions 178a, 878a, 978a.

In the latter case, an impact of having insufficient amounts of gettering material may be observed from the role of vanadium, which is disclosed in relation to earlier embodiments. That is, as referenced, Vanadium is often added to nickel sputtering targets in semiconductor manufacturing in order to avoid the effects of nickel's ferromagnetic properties of pure nickel, which ferromagnetic properties are undesirable for certain types of metal sputtering tools. Typical concentrations of vanadium additions are 7%, which is also the case with the Ni—V alloys described in earlier embodiments. This concentration of 7% is, however, insufficient to provide gettering of carbon at the level that is required for stability of the backside contact stack. The lower boundary for the amount of gettering metal in the Ohmic metal stack (layers 160 and 161 as schematically represented in FIG. 1) may be estimated as being between approximately 20% and 25%.

A minimum amount of a refractory metal (ReM) present in the Nickel-ReM metal stack to be laser annealed may be determines using stoichiometry rules. The amount of ReM should be sufficient to adsorb the carbon generated by the silicidation of Nickel with SiC, and without agglomeration of precipitates on non-reacted carbon at the top side of the nickel silicide.

Almost all nickel deposited onto SiC prior to the laser anneal will be reacted to form the nickel silicide; therefore, every atom of Ni will, on average, produce 0.33 to 0.67 atoms of carbon, depending on actual nickel silicide composition, which may vary from $Ni_3Si$ to $Ni_3Si_2$. The amount of refractory metal in the laser-annealed metal stack should be therefore sufficient to bind at least around 25% of the carbon due to the formation of nickel silicide from SiC and Ni. As referenced above, it is possible that all or almost all of the deposited nickel undergoes silicidation, because the refractory metal is dispersed and/or non-continuous, so little or no silicon is prevented by the refractory metal from diffusing through the layer of nickel.

A certain part of the released carbon may be still present in the nickel silicide in the form of free carbon precipitates in the bulk of the silicide. Part of those precipitates will be located next to silicide interface to SiC, whereas another part might be still present in the bulk of nickel silicide without reaching the top silicide surface, as was demonstrated in STEM analysis images of Option 2 process shown in FIG. 9. The part of non-reacted carbon in the bulk of Nickel silicide may be up to 75% of the total amount released due to the SiC reaction with Nickel. The remaining at least 25% of released carbon may be bound to the carbides of refractory metal in order to avoid non-reacted carbon at the top surface of the nickel silicide. As an example, the 50 nm of Ti utilized in the process Option 2 will theoretically consume up to 38% of the carbon generated by reaction of Nickel with SiC to form $Ni_2Si_3$. The number of 38% accounts to the 7% fraction of vanadium in the deposited Ni—V layers, as vanadium also takes part in gettering of the excessive carbon.

Exact minimum required amount of the refractory metal will depend on the stoichiometry of the carbide formed by the refractory metal. As an example, the stoichiometry coefficient is 1 for the case for Titanium, i.e. 1 atom of Ti binds 1 atom of carbon. If the refractory metal is introduced as a silicide, the silicon released due to the refractory metal carbide formation should be also accounted for in a corresponding stoichiometry calculation. A minimum required amount of the carbon gettering metal may depend on an exact configuration of the laser-annealed metal stack, as is clear from comparison of Options 1 and 2.

Positioning the gettering metal in the vicinity of the SiC surface, as is the case for Option 1 of FIG. 3A, may promote formation of refractory metal carbide next to the SiC surface. An example of said near-interfacial metal carbide layer is shown as layer 880 in FIG. 8A. Said near-interfacial refractory metal carbide will in turn promote formation of $Ni_3Si$ rather than of $Ni_3Si_2$, in which case a lower amount of carbon need be gettered.

In one aspect, the process of laser annealing the backside contact is not expected to provide perfect uniformity over the wafer. As an example, available lasers do not provide a possibility for exposing an entire wafer backside at required density level. The laser beam scanned over the wafer area, and certain stitching of exposed area is present. The stitching regions may be exposed under the conditions, which deviate from optimum, and full gettering of free carbon may not necessarily occur at the interface of the silicide Ohmic contact to the solder metal in such stitching regions.

Another possible source of irregularity might be contamination of the SiC surface prior to metal deposition, because the routines for cleaning the backside after wafer thinning may not fully comply with the same standards as those applied to the frontside process. Such regions of non-reacted carbon next to the solder metal regions were not observed in the samples formed according to Options 1, 2, or 3 according to this description; however, they may potentially appear in certain implementations.

The solder metal adhesion might be not dramatically impacted provided the interfacial carbon next to its interface is gettered to form refractory carbides in the dominant part of device area, in which case the resulting SiC device will not substantially deviate from that taught in this description. Regions of relatively poor solderable metal adhesion are expected to form a discontinuous network if their fraction does not exceed approximately one third of the total backside contact area, which number sets an example upper boundary for the fraction of said defective portions with non-gettered carbon in regions 178a. It is nevertheless preferred that said fraction should be kept as low as possible, preferably 0.1 or 0.01, or eliminated completely.

The laser anneal embodiments disclosed in the examples above were performed using a pulsed visible-light laser having a wavelength of 532 nm. This laser wavelength was chosen for the considerations of compatibility of SiC process with already existing process utilized for silicon device processing, but other wavelengths may also be suitable, e.g., between 170 nm and 10 microns.

Earlier disclosures of the laser anneal of NiSix Ohmic contacts to SiC are restricted to use of ultraviolet (UV) lasers, which lasers had a wavelength of between approximately 360 nm and 240 nm. A UV laser might have the advantage that the laser light penetrated through a portion of the exposed metal layer will be likely adsorbed in the SiC. This requirement is, however, not necessarily applied to the laser anneal of NiSix contacts to SiC. The laser damage of topside device features is indeed theoretically possible utilizing a visible-light anneal of the backside contact, because SiC is transparent to the visible laser power, which laser power might penetrate into SiC if annealed metal contact contains voids. Nevertheless, the laser damage to said topside device pattern can be eliminated for both the SiC Schottky-diode and to the SiC MOSFET process. This is achieved through application of standard semiconductor process control to avoid large voids in the metal stack to be laser-annealed.

The carbon gettering technique of NiSix laser-annealed Ohmic contact formation to SiC disclosed herein may be equally performed utilizing laser pulses of UV light. It may be also possible utilizing a pulsed infrared (IR) laser for the purpose of NiSix Ohmic contact anneal. The UV laser anneal can, for example, be used if the process stability is not good enough to ensure formation of continuous metallic film at the wafer backside, which continuous metallic film is required to protect the topside active-structure pattern from excessive exposure to the visible laser light. One advantage of using visible-light and IR laser systems might be their lower equipment cost, because pulsed UV radiation is often achieved by upconversion of either IR or of visible light.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A semiconductor power device, comprising:
   a Silicon Carbide (SiC) layer having a power device formed on a first surface thereof;
   an Ohmic contact layer formed on a second, opposing surface of the SiC layer, the Ohmic contact layer including Nickel Silicide (NiSix) with a first silicide region containing a first precipitate of non-reacted carbon disposed between the SiC layer and a second silicide region, the second silicide region disposed between the first silicide region and a third silicide region, and including a mixture of a first precipitate of refractory metal carbide and a second precipitate of non-reacted carbon, the third silicide region containing a second precipitate of refractory metal carbide; and
   at least one solder metal layer formed on the Ohmic contact layer with the third silicide region disposed between the second silicide region and the at least one solder metal layer.

2. The semiconductor power device of claim 1, wherein the first and second refractory metal carbide precipitates include at least 25% of carbon released from the SiC layer during silicidation to form the NiSix.

3. The semiconductor power device of claim 1, wherein a contact resistance between the Ohmic contact layer and the SiC layer is less than about 0.1 mOhm*cm2.

4. The semiconductor power device of claim 1, wherein the first and second precipitates of non-reacted carbon include carbon released from the SiC layer during silicidation to form the NiSix.

5. The semiconductor power device of claim 4, wherein the first refractory metal carbide precipitate and the second refractory metal carbide precipitate include precipitates of a first refractory metal included with the Nickel during formation of the Ohmic contact layer, and precipitates of a second refractory metal.

6. The semiconductor power device of claim 1, wherein carbon in the third silicide region is included within the second precipitate of refractory metal carbide over at least fifty percent of a contact area of the third silicide region with the at least one solder metal layer.

7. The semiconductor power device of claim 1, wherein the first and second refractory metal carbide precipitates are at least partially formed with a refractory metal having a carbon affinity and at least partially melted within the NiSix.

8. The semiconductor power device of claim 1, wherein the SiC layer has a thickness of less than 280 μm.

9. A semiconductor power device, comprising:
   a Silicon Carbide (SiC) layer having a device formed on a first surface thereof;
   an Ohmic contact layer formed on a second, opposing surface of the SiC layer, the Ohmic contact layer including Nickel Silicide (NiSix) with a first silicide region containing a first precipitate of non-reacted carbon disposed between the SiC layer and a second silicide region, the second silicide region disposed between the first silicide region and a third silicide region, and including a mixture of a first precipitate of refractory metal carbide and a second precipitate of non-reacted carbon, the third silicide region containing a second precipitate of refractory metal carbide; and
   at least one solder metal layer formed on the Ohmic contact layer with the third silicide region disposed between the second silicide region and the at least one solder metal layer,
   wherein the first refractory metal carbide precipitate and the second refractory metal carbide precipitate contain at least 25% of carbon released from the SiC layer during silicidation to form the NiSix.

10. The semiconductor power device of claim 9, wherein the third silicide region is substantially free of non-reacted carbon released from the SiC layer during silicidation to form the NiSix.

11. The semiconductor power device of claim 9, wherein a contact resistance between the Ohmic contact layer and the SiC layer is less than about 0.1 mOhm*cm2.

12. The semiconductor power device of claim 9, wherein the first and second refractory metal carbide precipitates are formed with a refractory metal having a carbon affinity and at least partially melted within the NiSix.

13. The semiconductor power device of claim 9, wherein the SiC layer has a thickness of less than about 280 μm.

14. A method of making a semiconductor power device, the method comprising:
   depositing a layer of Nickel onto a Silicon Carbide (SiC) substrate;

depositing, subsequent to the depositing of the layer of Nickel, a layer of a refractory metal onto the layer of Nickel;

performing at least one laser anneal of the layer of Nickel and the layer of the refractory metal, to form a Nickel Silicide Ohmic contact layer including refractory metal carbide precipitates; and depositing at least one solder metal on the Nickel Silicide Ohmic contact layer.

15. The method of claim 14, comprising:

depositing a second layer of Nickel on the refractory metal.

16. The method of claim 15, wherein the performing the at least one laser anneal comprises:

performing a first laser anneal after depositing the layer of Nickel and the layer of the refractory metal, and prior to depositing the second layer of Nickel; and performing a second laser anneal after the depositing of the second layer of Nickel.

17. The method of claim 15, wherein the performing the at least one laser anneal comprises:

performing a first laser anneal after depositing the layer of Nickel, and prior to the depositing of the layer of the refractory metal and the second layer of Nickel; and performing a second laser anneal after the depositing of the layer of the refractory metal and the second layer of Nickel.

18. The method of claim 14, wherein the performing the at least one laser anneal comprises:

performing the at least one laser anneal at a temperature sufficient to at least partially melt the layer of refractory metal.

19. The method of claim 14, comprising:

thinning the SiC substrate to a thickness of less than 280 µm prior to depositing the layer of Nickel thereon.

20. The method of claim 14, wherein depositing the layer of Nickel comprises:

depositing the layer of Nickel on a backside surface of the SiC substrate, the backside surface being opposed to a frontside surface on which a device structure is formed.

* * * * *